US010254649B2

(12) United States Patent
Mikami et al.

(10) Patent No.: US 10,254,649 B2
(45) Date of Patent: Apr. 9, 2019

(54) METHOD FOR PRODUCING OPTICAL WAVEGUIDE

(71) Applicants: TOKAI UNIVERSITY EDUCATIONAL SYSTEM, Tokyo (JP); NISSAN CHEMICAL INDUSTRIES, LTD., Tokyo (JP)

(72) Inventors: Osamu Mikami, Hiratsuka (JP); Kentaro Ohmori, Funabashi (JP); Hideyuki Nawata, Tokyo (JP)

(73) Assignees: TOKAI UNIVERSITY EDUCATIONAL SYSTEM, Tokyo (JP); NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/030,894

(22) PCT Filed: Oct. 16, 2014

(86) PCT No.: PCT/JP2014/077551
§ 371 (c)(1),
(2) Date: Apr. 21, 2016

(87) PCT Pub. No.: WO2015/060190
PCT Pub. Date: Apr. 30, 2015

(65) Prior Publication Data
US 2016/0252816 A1    Sep. 1, 2016

(30) Foreign Application Priority Data

Oct. 21, 2013  (JP) ................................ 2013-218530

(51) Int. Cl.
*G03F 7/075* (2006.01)
*G03F 7/09* (2006.01)
(Continued)

(52) U.S. Cl.
CPC ........ *G03F 7/091* (2013.01); *B29D 11/00663* (2013.01); *C08F 290/148* (2013.01);
(Continued)

(58) Field of Classification Search
None
See application file for complete search history.

(56) References Cited

U.S. PATENT DOCUMENTS 5,396,350 A * 3/1995 Beeson ...................... F21V 5/02
349/62
6,178,281 B1 * 1/2001 Sautter ................. G02B 6/1228
385/129

(Continued)

FOREIGN PATENT DOCUMENTS

CN    101027610 A    8/2007
CN    101676753 A    3/2010

(Continued)

OTHER PUBLICATIONS

Ciba Specialty Chemicals data sheet for Darocure TPO, 3 pages (2001).*

(Continued)

*Primary Examiner* — Martin J Angebranndt
(74) *Attorney, Agent, or Firm* — Oliff PLC (57) ABSTRACT

A method for producing an optical waveguide composing an optical path conversion component having an extremely low signal loss, allowing a high surface packaging density and high speed operation, and allowing high productivity. A method for producing an optical waveguide that propagates light from a surface of a support to an oblique direction not vertical to the surface, the method for producing an optical waveguide comprising the steps of: (1) providing an anti-reflective coating on the support; (2) placing a photosensitive resin composition on the anti-reflective coating, and (Continued)

exposing the photosensitive resin composition to a light ray entering from a direction non-vertical to the surface of the support through a photomask for curing the composition; and (3) removing the unexposed photosensitive resin composition by development; and an optical waveguide obtained by the method.

7 Claims, 2 Drawing Sheets (51) Int. Cl.
| | |
|---|---|
| G03F 7/16 | (2006.01) |
| G03F 7/20 | (2006.01) |
| G03F 7/30 | (2006.01) |
| G02B 6/138 | (2006.01) |
| G02B 6/122 | (2006.01) |
| G02B 6/26 | (2006.01) |
| C08F 290/14 | (2006.01) |
| C08G 77/16 | (2006.01) |
| C09D 183/04 | (2006.01) |
| C08G 77/20 | (2006.01) |
| C08G 77/00 | (2006.01) |
| G02B 1/111 | (2015.01) |
| B29D 11/00 | (2006.01) |
| G03F 7/00 | (2006.01) |
| G03F 7/32 | (2006.01) |

(52) U.S. Cl.
CPC ............ *C08G 77/20* (2013.01); *C08G 77/80* (2013.01); *C09D 183/04* (2013.01); *G02B 1/111* (2013.01); *G02B 6/1221* (2013.01); *G02B 6/138* (2013.01); *G02B 6/26* (2013.01); *G03F 7/0005* (2013.01); *G03F 7/0755* (2013.01); *G03F 7/16* (2013.01); *G03F 7/20* (2013.01); *G03F 7/32* (2013.01)

(56) References Cited

U.S. PATENT DOCUMENTS

| | | | | |
|---|---|---|---|---|
| 7,369,733 | B2* | 5/2008 | Kondo | G02B 6/122 |
| | | | | 385/123 |
| 7,382,959 | B1* | 6/2008 | Jacobsen | B82Y 20/00 |
| | | | | 385/129 |
| 7,635,555 | B2* | 12/2009 | Yang | G02B 6/138 |
| | | | | 430/321 |
| 2002/0164547 | A1* | 11/2002 | Ferm | G02B 6/1221 |
| | | | | 430/321 |
| 2003/0216537 | A1* | 11/2003 | Friedrich | C08G 77/04 |
| | | | | 528/24 |
| 2005/0245717 | A1* | 11/2005 | Kennedy | C03C 17/008 |
| | | | | 528/44 |
| 2006/0057501 | A1 | 3/2006 | Wu et al. | |
| 2006/0268418 | A1* | 11/2006 | Kim | G02B 6/0053 |
| | | | | 359/618 |
| 2007/0057348 | A1* | 3/2007 | Tsai | B81C 1/00063 |
| | | | | 257/619 |
| 2007/0190331 | A1* | 8/2007 | Charters | B32B 15/085 |
| | | | | 428/412 |
| 2008/0085458 | A1* | 4/2008 | Yamato | C07C 309/65 |
| | | | | 430/7 |
| 2008/0272450 | A1* | 11/2008 | Tseng | H01L 27/1462 |
| | | | | 257/432 |
| 2009/0052856 | A1* | 2/2009 | Bae | G02B 6/1221 |
| | | | | 385/131 |
| 2009/0130594 | A1* | 5/2009 | Takei | G03F 7/091 |
| | | | | 430/271.1 |
| 2009/0252471 | A1* | 10/2009 | Kondo | C08G 77/20 |
| | | | | 385/132 |
| 2009/0297981 | A1 | 12/2009 | Itagaki et al. | |
| 2010/0019399 | A1* | 1/2010 | Kimura | C08F 283/12 |
| | | | | 257/791 |
| 2010/0067849 | A1 | 3/2010 | Hikita et al. | |
| 2010/0104827 | A1* | 4/2010 | Yorisue | C08F 290/148 |
| | | | | 428/195.1 |
| 2011/0063255 | A1 | 3/2011 | Nagafuji et al. | |
| 2013/0029057 | A1* | 1/2013 | Laksin | B05D 3/0493 |
| | | | | 427/488 |
| 2018/0305488 | A1* | 10/2018 | Nagasawa | C08F 230/08 |

FOREIGN PATENT DOCUMENTS

| | | | | |
|---|---|---|---|---|
| CN | 101002142 | B | 12/2010 | |
| JP | 09-318838 | * | 12/1997 | ............ G02B 6/28 |
| JP | 2005-084165 | A | 3/2005 | |
| JP | 2006-501523 | A | 1/2006 | |
| JP | 2007-078818 | A | 3/2007 | |
| JP | 2007-525685 | A | 9/2007 | |
| JP | 2007-334343 | A | 12/2007 | |
| JP | 2008-007642 | * | 1/2008 | |
| JP | 2008-088195 | * | 4/2008 | ........... G02F 1/1335 |
| JP | 2012-142446 | * | 7/2012 | ............ H01L 27/14 |
| JP | 2013-045028 | A | 3/2013 | |
| TW | 201109749 | A | 3/2011 | |
| WO | 2004/073972 | A1 | 9/2004 | |
| WO | 2007/128041 | A1 | 11/2007 | |
| WO | 2012/097836 | * | 7/2012 | |
| WO | 2012/097836 | A1 | 7/2012 | |

OTHER PUBLICATIONS

Tokudome et al., "Controlled site modification of inorganic networks in hybrid photocurable resins for high thermal crack resistance", J. Sol-Gel Sci. Technol., vol. 65 pp. 318-323 (2013)(published on line Dec. 2012).*
Ciba specialty chemicals, "Photoinitiators for UV curing", 8 pages (2003).*
Jan. 27, 2015 Search Report issued in International Patent Application No. PCT/JP2014/077551.
Jan. 27, 2015 Written Opinion issued in International Patent Application No. PCT/JP2014/077551.
Kanda, Masahiro et al. "Self-Written Optical Connection Rod on VCSEL Fabricated by Mask Transfer Method and Its Optical Characteristic," The Transactions of the Institute of Electronics, Information and Communication Engineers, vol. J90-C, No. 11, pp. 785-792, 2007.
Obata, Yusuke et al. "Multi-Array Self-Written Waveguide using Mask," Proceedings of JIEP Annual Meeting, The 19th JIEP Annual Meeting Session ID:16C-09, 2005.
May 18, 2017 Extended Search Report issued in European Patent Application No. 14856282.0.
Nov. 28, 2017 Office Action issued in Taiwanese Patent Application No. 103136160.

* cited by examiner

METHOD FOR PRODUCING OPTICAL WAVEGUIDE

TECHNICAL FIELD

The present invention relates to a method for producing an optical waveguide, particularly to a method for producing an optical waveguide that inclines to a surface of a support (substrate) in a desired oblique angle.

BACKGROUND ART

In recent years, as development of information and communication devices have been advanced, capacities for signal lines in the devices have become insufficient. To solve this problem, copper electrical wiring of print substrates in the devices has been tried to be partly substituted with optical fibers or optical waveguides in order to utilize optical signals instead of electrical signals. Unlike the case of connecting between devices, in the inside of the devices, high density optical interconnection needs to be packed in a limited space, and thus, as in the case of ICs and multichip modules, photoelectric elements such as laser diodes and photodiodes are generally packed on surfaces of substrates, so that optical interconnection is laminated on the same substrates as those of electrical circuit boards.

Optical and electrical wiring substrates on which optical waveguides and electrical wiring are laminated on the same substrate are desirable structures because they enable high packaging densities and high-speed operations, as well as miniaturization. However, those substrates need a technique for converting optical paths in depthwise directions in order to optically connect optical axes of optical waveguides to photoelectric elements such as laser diodes and photodiodes.

As examples of such optical path conversion components, a method in which a microlens is used (see Patent Document 1) and a method in which an optical waveguide is bent into an L-shape for optical coupling have been developed (see Patent Document 2).

PRIOR ART DOCUMENTS

Patent Documents

Patent Document 1: Japanese Patent Application Publication No. 2005-84165 (JP 2005-84165 A)
Patent Document 2: Japanese Patent Application Publication No. 2007-334343 (JP 2007-334343 A)

SUMMARY OF THE INVENTION

Problem to be Solved by the Invention

Because of its technical maturity, silicon photonics is preferably used in an optical waveguide network used for the optical interconnection. In the silicon photonics, light transmitting from a silicon diffraction grating is output to upside in an angle slightly inclined from 90 degrees, and thus optical path conversion components need to efficiently connect sloped optical signals having inclined output angles to waveguides.

In a method disclosed in Patent Document 1, for example, optical signals are collected by using a microlens to allow optical coupling in 90 degrees; however, if such a method is utilized in conventional optical path conversion components, optical signals having inclined output angles cannot be efficiently transmitted.

Meanwhile, as described in Patent Document 2, a technique in which an optical waveguide is laid out in an L-shape in a through-hole that passes through an upper layer substrate is used for a multilayered optical-electrical composite substrate. However, the through-hole is difficult to be shaped obliquely, and equipment will be expensive because a pulsed laser is used to weld a waveguide and an optical path conversion component, which results in poor mass productivity.

The present invention was completed in view of the circumstances above, and provides a method for producing an optical waveguide composing an optical path conversion component having an extremely low signal loss, allowing a high surface packaging density and high speed operation, and allowing high productivity.

Another problem to be solved by the present invention is to provide a composition for forming an anti-reflective coating suitable for producing the optical waveguide.

Means for Solving the Problem

As a result of intensive study to achieve the objectives above, the inventors of the present invention have found that when a photosensitive resin composition (a material for forming optical waveguides) placed on a substrate is exposed to a light ray entering from a direction non-vertical to the surface of the substrate, an optical waveguide having a desired angle inclined to the surface of the substrate can be formed by providing an anti-reflective coating between the substrate and the material for forming optical waveguides, and a resulting optical waveguide can efficiently transmit optical signals having the inclined output angle, and whereby completed the present invention.

That is, as a first aspect, the present invention relates to a method for producing an optical waveguide that propagates light from a surface of a support to an oblique direction not vertical to the surface, the method for producing an optical waveguide comprising the steps of:

(1) providing an anti-reflective coating on the support;
(2) placing a photosensitive resin composition on the anti-reflective coating, and exposing the photosensitive resin composition to a light ray entering from a direction non-vertical to the surface of the support through a photomask for curing the composition; and
(3) removing the unexposed photosensitive resin composition by development.

As a second aspect, the present invention relates to the method for producing an optical waveguide according to the first aspect, in which the anti-reflective coating is a film formed from a polymerizable composition comprising:

(a) 100 parts by mass of a reactive silicone compound obtained by polycondensing a diaryl silicate compound of Formula [1] and an alkoxy silicon compound of Formula [2] under the presence of an acid or a base; and
(b) 0.1 to 10 parts by mass of an ultraviolet absorber:

[1]

[2]

(where each of $Ar^1$ and $Ar^2$ is independently a phenyl group optionally substituted with a $C_{1-6}$ alkyl group; $Ar^3$ is a phenyl group having at least one group having a polymerizable double bond or a naphthyl group having at least one group having a polymerizable double bond; $R^1$ is a methyl group or an ethyl group; $R^2$ is a methyl group, an ethyl group, or a vinylphenyl group; and a is 2 or 3).

As a third aspect, the present invention relates to the method for producing an optical waveguide according to the second aspect, in which the photosensitive resin composition comprises the reactive silicone compound (a).

As a fourth aspect, the present invention relates to an optical waveguide obtained by the method for producing an optical waveguide according to any one of the first to the third aspects, in which the optical waveguide has an aspect ratio of 3 or more.

As a fifth aspect, the present invention relates to an optical waveguide obtained by the method for producing an optical waveguide according to any one of the first to the third aspects, in which an angle between the optical waveguide and the surface of the support is not less than 60 degrees, but less than 90 degrees.

As a sixth aspect, the present invention relates to a composition for forming an anti-reflective coating comprising:

(a) 100 parts by mass of a reactive silicone compound obtained by polycondensing a diaryl silicate compound of Formula [1] and an alkoxy silicon compound of Formula [2] under the presence of an acid or a base; and (b) 0.1 to 10 parts by mass of an ultraviolet absorber:

[1]

[2]

(where each of $Ar^1$ and $Ar^2$ is independently a phenyl group optionally substituted with a $C_{1-6}$ alkyl group; $Ar^3$ is a phenyl group having at least one group having a polymerizable double bond or a naphthyl group having at least one group having a polymerizable double bond; $R^1$ is a methyl group or an ethyl group; $R^2$ is a methyl group, an ethyl group, or a vinylphenyl group; and a is 2 or 3).

Effects of the Invention

According to the present invention, an optical waveguide can be provided on a support, such as a silicon wafer that is a substrate having a mirror surface, by photolithography such that the optical waveguide is inclined to the surface in a desired angle.

Also, according to the present invention, an optical waveguide that can efficiently transmit optical signals having the inclined output angle can be produced easily, with a low cost.

MODES FOR CARRYING OUT THE INVENTION

The present invention relates to a method for producing an optical waveguide, particularly to a method for producing an optical waveguide that propagates light from a surface of a support to an oblique direction not vertical to the surface, the method for producing an optical waveguide comprising the steps of:

(1) providing an anti-reflective coating on the support;

(2) placing a photosensitive resin composition on the anti-reflective coating, and exposing the photosensitive resin composition to a light ray entering from a direction non-vertical to the support of the substrate through a photomask for curing the composition; and (3) removing the unexposed photosensitive resin composition by development.

Hereinafter, firstly, a composition for forming an anti-reflective coating that is for forming the anti-reflective coating provided in the step (1), and the photosensitive resin composition used in the step (2) will be explained.

<<Composition for Forming Anti-Reflective Coating>>

The anti-reflective coating provided in an optical waveguide obtained by the method for producing an optical waveguide of the present invention is formed from a polymerizable composition (a composition for forming an anti-reflective coating) containing the reactive silicone compound (a) and the ultraviolet absorber (b).

The composition for forming an anti-reflective coating used in the production method of the present invention is also within the scope of the present invention.

<Reactive Silicone Compound (a)>

The reactive silicone compound (a) used in the present invention is a compound obtained by polycondensing a diaryl silicate compound having a specific structure and an alkoxy silicon compound having a specific structure under the presence of an acid or a base.

[Diaryl Silicate Compound]

The diaryl silicate compound is a compound of Formula [1] below.

[1]

In Formula [1], each of $Ar^1$ and $Ar^2$ is independently a phenyl group optionally substituted with a $C_{1-6}$ alkyl group.

Examples of $Ar^1$ and $Ar^2$ include a phenyl group, an o-tolyl group, an m-tolyl group, a p-tolyl group, a 4-ethylphenyl group, a 4-isopropylphenyl group, a 4-tert-butylphenyl group, a 3,5-dimethylphenyl group, a 3,5-diethylphenyl group, a 3,5-diisopropylphenyl group, and a 2,4,6-trimethylphenyl group.

Specific examples of the Formula [1] include diphenylsilanediol, bis(m-tolyl)silanediol, bis(4-ethylphenyl)silanediol, and bis(4-isopropylphenyl)silanediol, but not limited thereto.

[Alkoxy Silicon Compound]

The alkoxy silicon compound is a compound of Formula [2] below.

$$Ar^3-Si(OR^1)_a R^2_{3-a} \quad [2]$$

In Formula [2], $Ar^3$ is a phenyl group having at least one group having a polymerizable double bond or a naphthyl group having at least one group having a polymerizable double bond; $R^1$ is a methyl group or an ethyl group; $R^2$ is a methyl group, an ethyl group, or a vinylphenyl group; and a is 2 or 3.

Examples of the phenyl group having at least one group having a polymerizable double bond of $Ar^3$ include a 2-vinylphenyl group, a 3-vinylphenyl group, a 4-vinylphenyl group, a 4-vinyloxyphenyl group, a 4-allylphenyl group, a 4-allyloxyphenyl group, and a 4-isopropenylphenyl group.

Examples of the naphthyl group having at least one group having a polymerizable double bond of $Ar^3$ include a 4-vinylnaphthalen-1-yl group and a 6-vinylnaphthalen-2-yl group.

In a preferable compound of Formula [2], $Ar^3$ is a vinylphenyl group, and a is 3.

Specific examples of Formula [2] include trimethoxy(4-vinylphenyl)silane, triethoxy(4-vinylphenyl)silane, dimethoxy(methyl)(4-vinylphenyl)silane, and dimethoxybis(4-vinylphenyl)silane, but not limited thereto.

[Mixing Ratio of Diaryl Silicate Compound and Alkoxy Silicon Compound]

When a diaryl silicate compound of Formula [1] and an alkoxy silicon compound of Formula [2], which are used in a reactive silicone compound of the component (a), are subjected to a polycondensation reaction, a mixing molar ratio is not particularly limited; however, the mixing molar ratio is preferably in the range of: a diaryl silicate compound: an alkoxy silicon compound=2:1 to 1:2, in order to avoid producing a block copolymer. More preferably, the mixing molar ratio is in the range of 1.1:0.9 to 0.9:1.1.

Compounds used as the diaryl silicate compounds or the alkoxy silicon compounds can suitably be selected as necessary, and two or more compounds can also be used together in combination. Also in this case, a molar ratio of a total molar amount of diaryl silicate compounds and a total molar amount of alkoxy silicon compounds is within the range above.

[Acidic or Basic Catalyst]

A polycondensation reaction between a diaryl silicate compound of Formula [1] and an alkoxy silicon compound of Formula [2] is preferably performed under the presence of an acidic or basic catalyst.

The catalyst used in the polycondensation reaction is not particularly limited, and can suitably be selected for use as necessary as long as it is dissolved or uniformly dispersed in a solvent, which will be explained later.

Examples of the catalyst that can be used include $B(OR)_3$, $Al(OR)_3$, $Ti(OR)_4$, and $Zr(OR)_4$ as acidic compounds; alkali metal hydroxides, alkaline earth metal hydroxides, ammonium salts, and amines as basic compounds; and $NH_4F$ and $NR_4F$ as fluoride salts. Here, R is one or more groups selected from the group consisting of a hydrogen atom, $C_{1-12}$ linear alkyl groups, $C_{3-12}$ branched alkyl groups, and $C_{3-12}$ cyclic alkyl groups.

Each of these catalysts can be used singly, or two or more of them can be used in combination.

Examples of the acidic compounds include boric acid, trimethoxyboron, triethoxyboron, tri-n-propoxyboron, tri-isopropoxyboron, tri-n-butoxyboron, triisobutoxyboron, tri-sec-butoxyboron, tri-tert-butoxyboron, trimethoxyaluminum, triethoxyaluminum, tri-n-propoxyaluminum, triisopropoxyaluminum, tri-n-butoxyaluminum, triisobutoxyaluminum, tri-sec-butoxyaluminum, tri-tert-butoxyaluminum, tetramethoxytitanium, tetraethoxytitanium, tetra-n-propoxytitanium, tetraisopropoxytitanium, tetra-n-butoxytitanium, tetraisobutoxytitanium, tetra-sec-butoxytitanium, tetra-tert-butoxytitanium, tetramethoxyzirconium, tetraethoxyzirconium, tetra-n-propoxyzirconium, tetraisopropoxyzirconium, tetra-n-butoxyzirconium, tetraisobutoxyzirconium, tetra-sec-butoxyzirconium, and tetra-tert-butoxyzirconium.

Examples of the basic compounds include sodium hydroxide, potassium hydroxide, magnesium hydroxide, calcium hydroxide, strontium hydroxide, barium hydroxide, ammonium hydroxide, tetramethylammonium hydroxide, tetrabutylammonium hydroxide, and triethylamine.

Examples of the fluoride salts include ammonium fluoride, tetramethylammonium fluoride, and tetrabutylammonium fluoride.

Among these catalysts, one or more catalysts selected from the group consisting of tetraisopropoxytitanium (titanium tetraisopropoxide), magnesium hydroxide, calcium hydroxide, strontium hydroxide, and barium hydroxide are preferably used.

An amount of the catalyst to be used is 0.01 to 10% by mass and preferably 0.1 to 5% by mass relative to a total mass of the diaryl silicate compound and the alkoxy silicon compound. When the amount is 0.01% by mass or more, reactions proceed more satisfactorily. Economically, 10% by mass or less is sufficient to use.

[Polycondensation Reaction]

One of the characteristics of the reactive silicone compound according to the present invention is the structure of the alkoxy silicon compound. A reactive group (polymerizable double bond) contained in the alkoxy silicon compound used in the present invention is easily polymerized by radical polymerization or ionic (anionic or cationic) polymerization, and shows excellent thermostability after polymerization (after curing).

To produce a highly thermostable silicone compound by polycondensing the alkoxy silicon compound and the diaryl silicate compound, the reaction needs to be terminated at a suitable degree of polymerization so that the product can be kept in a liquid state. Because the alkoxy silicon compound used in the present invention is not actively hydrolyzed, the polycondensation reaction with the diaryl silicate compound is mild, and the degree of polymerization can easily be controlled.

Although the polycondensation reaction of the alkoxy silicon compound and the diaryl silicate compound by dealcoholization can be performed without a solvent, a solvent that is inactive to the alkoxy silicon compound, such as toluene, can be used as a reaction solvent. Such solvents will be explained later. An advantage of not using a solvent is that alcohol as a reaction by-product can easily be removed by distillation. Meanwhile, an advantage of using a reaction solvent is that, it is easy to make a reaction system uniform, and thus a more stable polycondensation reaction can be performed.

As mentioned above, although the synthetic reaction of the reactive silicone compound can be performed without a solvent, a solvent can be used to allow the reaction to be more uniform. The solvent is not particularly limited as long as the solvent does not react with the diaryl silicate compound and the alkoxy silicon compound, and as long as a condensate of these compounds can be dissolved therein.

Examples of the reaction solvent include ketones, such as acetone and methyl ethyl ketone (MEK); aromatic hydrocarbons, such as benzene, toluene, and xylene; glycols, such as ethylene glycol, propylene glycol, and hexylene glycol; glycol ethers, such as ethyl cellosolve, butyl cellosolve, ethyl carbitol, butyl carbitol, diethyl cellosolve, and diethyl carbitol; and amides, such as N-methyl-2-pyrrolidone (NMP) and N,N-dimethylformamide (DMF). These solvents may be used singly, or two or more of them may be used in combination.

The reactive silicone compound used in the present invention can be obtained by performing dealcoholization condensation of a diaryl silicate compound of Formula [1] and an alkoxy silicon compound of Formula [2] under the presence of an acidic or basic catalyst. In order to avoid mixing of water, the reaction is preferably performed under inert gas atmosphere, such as nitrogen gas atmosphere. A reaction temperature is in the range of 20 to 150° C. and more preferably 30 to 120° C.

A reaction time is not particularly limited as long as the time is long enough to complete molecular weight increase of the polycondensate and to stabilize molecular weight distribution. Specifically, the reaction time is in the range of several hours to several days.

After the polycondensation reaction is completed, the obtained reactive silicone compound is collected by any methods, for example, by filtration, or by removing a solvent with distillation. Preferably, the collected compound is purified as necessary.

The weight-average molecular weight Mw of the polycondensation compound thus obtained measured by GPC in terms of polystyrene is 500 to 10,000, and the degree of distribution Mw (weight average molecular weight)/Mn (number average molecular weight) is 1.0 to 10.

<Ultraviolet Absorber (b)>

An ultraviolet absorber is not particularly limited as long as it is a compound that absorbs ultraviolet. Conventional ultraviolet absorbers, such as benzotriazoles, triazines, benzophenones, and benzoates can be used.

Specific examples of commercially available ultraviolet absorbers include TINUVIN (registered trademark) P, TINUVIN 120, TINUVIN 213, TINUVIN 234, TINUVIN 326, TINUVIN 329, TINUVIN 571, and TINUVIN 1577 [all of the above are manufactured by BASF Japan Ltd.]; and ADEKA STAB (registered trademark) LA-29, ADEKA STAB LA-31, ADEKA STAB LA-31RG, ADEKA STAB LA-31G, ADEKA STAB LA-32, ADEKA STAB LA-36, ADEKA STAB LA-36RG, ADEKA STAB LA-46, ADEKA STAB 1413, and ADEKA STAB LA-F70 [all of the above are manufactured by ADEKA Corporation].

An addition amount is 0.1 to 10 parts by mass, more preferably 0.3 to 5 parts by mass relative to 100 parts by mass of the reactive silicone compound (a).

<Polymerization Initiator (c)>

In addition to the reactive silicone compound (a) and the ultraviolet absorber (b), the composition for forming an anti-reflective coating of the present invention may further contain polymerization initiator (c). As the polymerization initiator, any of a photopolymcrization initiator and a thermal polymerization initiator can be used.

Examples of the photopolymerization initiator include alkylphenones, benzophenones, acylphosphine oxides, Michler's benzoyl benzoates, oxime esters, tetramethylthiuram monosulfides, and thioxanthones.

In particular, photofragmentation type photo radical polymerization initiators are preferred. Examples of the photofragmentation type photo radical polymerization initiator include those described in "The Latest UV Curing Technique" (page 159; Publisher: Kazuhiro Takausu; Publishing company: Technical Information Institute Co. Ltd.; published in 1991).

Examples of the commercially available photo radical polymerization initiator include IRGACURE (registered trademark) 184, IRGACURE 369, IRGACURE 651, IRGACURE 500, IRGACURE 819, IRGACURE 907, IRGACURE 784, IRGACURE 2959, IRGACURE CGI1700, IRGACURE CGI1750, IRGACURE CGI1850, IRGACURE CG24-61, IRGACURE 1116, IRGACURE 1173, IRGACURE TPO [all of the above are manufactured by BASF Japan Ltd.]; and ESACURE KIP150, ESACURE KIP65LT, ESACURE KIP100F, ESACURE KT37, ESACURE KT55, ESACURE KTO46, ESACURE KIP75 [all of the above are manufactured by Lamberti S.p.A.].

Examples of the thermal polymerization initiator include azos and organic peroxides.

Examples of the commercially available azo thermal polymerization initiator include V-30, V-40, V-59, V-60, V-65, and V-70 [all of the above are manufactured by Wako Pure Chemical Industries, Ltd.].

Examples of the commercially available organic peroxide thermal polymerization initiator include Perkadox (registered trademark) CH, Perkadox BC-FF, Perkadox 14, and Perkadox 16; Trigonox (registered trademark) 22, Trigonox 23, and Trigonox 121; Kayaester (registered trademark) P and Kayaester O; and Kayabutyl (registered trademark) B [all of the above are manufactured by Kayaku Akzo Corporation], but not limited thereto.

When the polymerization initiator is added, each of the polymerization initiators may be used singly, or two or more of them may be used in combination. An addition amount is 0.1 to 20 parts by mass, more preferably 0.3 to 10 parts by mass relative to 100 parts by mass of the reactive silicone compound (a).

<Other Component>

Unless the effects of the present invention are impaired, other components, such as reactive diluents (divinylbenzenes or the like), surfactants, leveling agents, antifoaming agents, and adhesion improving agents can be added to the composition for forming an anti-reflective coating, if necessary.

<Method for Preparing Polymerizable Composition>

A method for preparing polymerizable composition in the present embodiment is not particularly limited. Examples of the method for preparing polymerizable composition include a method in which the component (a), the component (b), and if necessary, the component (c) are mixed in predetermined proportions, if desired, other component is further added, and mixed to obtain a uniform solution; or a method in which a conventional solvent is further added in addition to the above components.

The proportion of a solid content in the polymerizable composition is not particularly limited as long as each of components is uniformly dissolved in the solvent. The proportion of the solid content is, for example, 1 to 50% by mass, 1 to 30% by mass, or 1 to 25% by mass. The solid content refers to total components of a polymerizable composition excluding a solvent component.

<<Photosensitive Resin Composition>>

The photosensitive resin composition used in the method for producing an optical waveguide of the present invention preferably contains the reactive silicone compound (a), and further contains the photopolymerization initiator, and if necessary, contains other components.

Specific examples thereof that can suitably be used are: the reactive silicone compounds described in the <Reactive Silicone Compound (a)>, photopolymerization initiators described in the <Polymerization Initiator (c)>, and other components described in the <Other Component>, and suitable mixing amounts thereof are also in the ranges described above.

<<Method for Producing Optical Waveguide>>

An optical waveguide of the present invention comprises the steps of: (1) providing an anti-reflective coating on the support; (2) placing a photosensitive resin composition on the anti-reflective coating, and exposing the photosensitive resin composition from a direction non-vertical to the surface of the anti-reflective coating through a photomask; and (3) removing the unexposed photosensitive resin composition by development Hereinafter, these steps will be explained in detail.

<(1) Step of Providing Anti-Reflective Coating on Support>

Firstly, an anti-reflective coating is formed on a support.

A support (substrate) used herein preferably has an excellent flatness, and examples thereof include supports made from silicon, glass, ceramics, metals, and plastics. Examples of the shape of the support include plate shape and film shape.

Commercial products are preferably used because they are easily available, and a silicon wafer and a glass wafer, and also a composite material substrate for printed wiring boards can preferably be used as a support.

Examples of the substrate made from plastics include substrates made from polycarbonate, poly(meth)acrylate, polyethersulfone, polyurethane, polysulfone, polyether, polyetherketone, polyolefin, poly(ethylene terephthalate), polyacrylonitrile, triacetylcellulose, diacetylcellulose, polyimide, and acetate butyrate cellulose.

The support is coated with the composition for forming an anti-reflective coating with a coating method, such as a spin coating method, a blade coating method, a dip coating method, a roll coating method, a bar coating method, a dye coating method, an ink-jet method, a dispenser method, a printing method (letterpress printing, intaglio printing, planography, or screen printing) or the like, and if a solvent is contained, the solvent is dried to form an anti-reflective coating. Although the obtained anti-reflective coating is preferably cured by treating it with light irradiation or heat, the curing treatment is not essential from the viewpoint of making the steps simple.

Light irradiation after coating can be performed by using radiation (ultraviolet or the like) from a laser light source, a mercury lamp, a metal halide lamp, a xenon lamp, an excimer lamp, an UV-LED, or the like, and post exposure bake can also be performed, if necessary.

As conditions of heat treatment after coating, a temperature for heat treatment is, for example, 80 to 250° C. and preferably 150 to 250° C. A time for heat treatment is, for example, 0.2 to 60 minutes and preferably 0.5 to 30 minutes.

The film thickness of the anti-reflective coating is preferably 10 to 30 μm. When the film thickness of the anti-reflective coating is less than 10 μm (thin), reflected light from exposure light may not be prevented effectively in an exposure step, which will be explained later, and the shape of an obtained waveguide may become a V-shape because the photosensitive resin composition is exposed to exposure light and reflected light thereof.

<(2) Step of Exposing>

Next, the photosensitive resin composition is placed on the anti-reflective coating formed in the previous step, and the photosensitive resin composition is exposed toward the surface of the anti-reflective coating through a photomask.

In particular, the production method of the present invention is characterized in that the photosensitive resin composition is exposed to a light ray entering from a direction non-vertical to the surface of the support (substrate). Preferably, a light ray for exposure is entered from a direction that is not less than 60 degrees and less than 90 degrees and more preferably not less than 75 degrees and less than 80 degrees, for example 80 degrees, to the surface of the support.

Examples of the radiation used for the exposure include radiation (ultraviolet or the like) from a laser light source, a mercury lamp, a metal halide lamp, a xenon lamp, an excimer lamp, and an UV-LED. A refractive index and a length of an optical waveguide to be produced can be controlled by an amount of radiation. Usually, a suitable amount of radiation is several hundreds to several tens of thousands mJ/cm$^2$.

A wavelength for radiation is 100 to 600 nm, preferably 200 to 500 nm, and more preferably 250 to 410 nm.

<(3) Step of Removing Unexposed Photosensitive Resin Composition by Development>

Next, an area not irradiated with radiation (uncured portion) is developed with an organic solvent (washing), and is removed.

The organic solvent used herein is not particularly limited as long as the photosensitive resin composition can be dissolved in the solvent, and examples thereof include alcohols, such as methanol, ethanol, 1-propanol, 2-propanol, and butanol; ketones, such as acetone, methyl ethyl ketone (MEK), and methyl isobutyl ketone (MIBK); aromatic hydrocarbons, such as benzene, toluene, and xylene; glycols, such as ethylene glycol, propylene glycol, and hexylene glycol; glycol ethers, such as ethyl cellosolve, butyl cellosolve, ethyl carbitol, butyl carbitol, diethyl cellosolve, and diethyl carbitol; and amides, such as N-methyl-2-pyrrolidone (NMP) and N,N-dimethylformamide (DMF). These solvents may be used singly, or two or more of them may be used in combination.

EXAMPLES

Hereinafter, the present invention will be explained more specifically according to Examples; however, the present invention is not limited to Examples below.

Devices and conditions used in Examples for preparation of samples and analyses of physical properties will be listed below.

(1) $^1$H NMR Spectrum

Device: JNM-ECX300, manufactured by JEOL Ltd.

Measurement Solvent: CDCl$_3$

Standard Substance: Tetramethylsilane (0.00 ppm)

(2) Gel Permeation Chromatography (GPC)

Device: HLC-8320GPC, manufactured by Tosoh Corporation

Column: Shodex (registered trademark) GPC KF-802.5 and GPC KF-803, manufactured by Showa Denko K.K.

Column temperature: 40° C.

Solvent: Tetrahydrofuran

Detector: UV (254 nm)

Standard curve: Standard polystyrene (3) Stirring Deaerator

Device: Planetary centrifugal mixer, Awatori Rentaro (registered trademark) ARE-310, manufactured by THINKY Corporation (4) UV Exposure Device: Batchwise UV irradiation device (high pressure mercury lamp 2 kW×1 lamp), manufactured by EYE GRAPHICS Co., Ltd.

(5) UV Spot Light Source

Device: EXECURE (registered trademark) 3000, manufactured by HOYA CANDEO OPITRONICS Corporation (6) Microscope Device: Digital microscope KH-7700, manufactured by HIROX Co., Ltd.

(7) Mask Aligner

Device: MA6, manufactured by SUSS MicroTec ICK.

(8) Halogen Lamp

Device: White light source AQ4305, manufactured by Yokogawa Meters & Instruments Corporation (9) Optical Spectrum Analyzer Device: Q8381A, manufactured by ADVANTEST Corporation (10) Measurement of Refractive Index Device: Prism Coupler model 2010, manufactured by Metricon Corporation Abbreviations refer to the following meanings.

DVB: Divinylbenzene [manufactured by NIPPON STEEL & SUMIKIN CHEMICAL Co., Ltd., 81% purity]

IPA: 2-propanol

MIBK: methyl isobutyl ketone

TIN329: 2-(2-hydroxy-5-tert-octylphenyl)benzotriazole [TINUVIN (registered trademark) 329, manufactured by BASF Japan Ltd.]

TPO: Diphenyl(2,4,6-trimethylbenzoyl)phosphine oxide [IRGACURE (registered trademark) TPO, manufactured by BASF Japan Ltd.]

[Production Example 1] Production of Reactive Silicone Compound

In an 1 L egg-plant shaped flask equipped with a condenser, 177 g (0.80 mol) of diphenylsilanediol [manufactured by Tokyo Chemical Industry Co., Ltd.], 179 g (0.80 mol) of trimethoxy(4-vinylphenyl)silane [manufactured by Shin-Etsu Chemical Co., Ltd.], and 141 g of toluene were placed, and air in the flask was substituted with nitrogen, by using a nitrogen balloon. The reaction mixture was heated to 50° C., and 0.303 g (1.6 mmol) of barium hydroxide monohydrate [manufactured by Aldrich Chemical Co.] was added thereto. After that, the mixture was further stirred at 50° C. for 2 days in order to perform dealcoholization condensation. The reaction mixture was cooled to a room temperature (around 25° C.), and insoluble matter was removed through a membrane filter having a pore size of 0.2 μm. By using a rotary evaporator, toluene and methanol, which was a by-product, were removed from the reaction mixture at 50° C. by vacuum distillation, and 305 g of a colorless, transparent, and oily reactive silicone compound was obtained.

Figure 1:
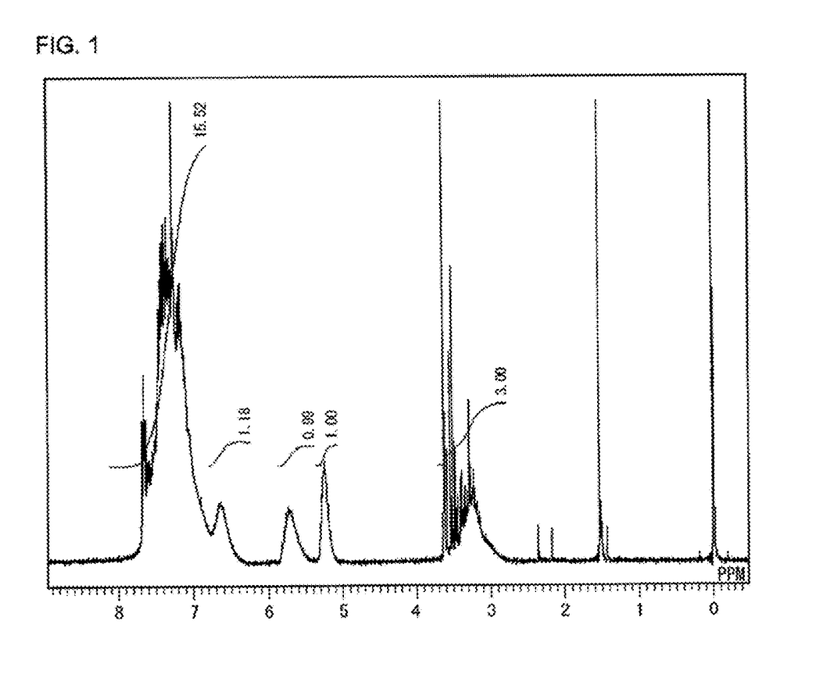
FIG. 1 shows $^1$H NMR spectra of a reactive silicone compound obtained in Production Example 1.

$^1$H NMR spectra of the obtained reactive silicone compound are shown in FIG. 1. The weight-average molecular weight Mw measured by GPC in terms of polystyrene was 1,600 and the degree of distribution Mw (weight average molecular weight)/Mn (number average molecular weight) was 1.3.

[Production Example 2] Preparation of Photosensitive Resin Composition 7 parts by mass of DVB was added to 100 parts by mass of the reactive silicone compound produced in Production Example 1, and mixed homogeneously by using a stirring deacrator. As a polymerization initiator, 3 parts by mass of TPO was mixed in 100 parts by mass of the mixture, and stirred and deacrated for 10 minutes to obtain a photosensitive resin composition.

[Example 1] Preparation of Composition for Forming Anti-Reflective Coating 25 parts by mass of DVB was added to 100 parts by mass of the reactive silicone compound produced in Production Example 1, and mixed homogeneously by using a stirring deaerator. 100 parts by mass of the mixture, 3 parts by mass of TIN329 as an ultraviolet absorber, and 1 part by mass of TPO as a polymerization initiator were mixed, and stirred and deaerated for 10 minutes to obtain a composition for forming an anti-reflective coating.

[Example 2] Production of Inclined Optical Waveguide

A bare silicon wafer was spin-coated (1,000 rpm×60 seconds) with the composition for forming an anti-reflective coating prepared in Example 1. The coating was exposed to UV with 20 mW/cm$^2$ for 2 minutes in a nitrogen atmosphere. After that, the coating was heated at 150° C. for 5 minutes, and then was further heated at 200° C. for 1 minute to form an anti-reflective coating having a thickness of 12.9 μm.

100 mg of the photosensitive resin composition prepared in Production Example 2 was added dropwise onto the silicon wafer having the anti-reflective coating. A photomask having 3 circular openings with diameters of 50 μm was placed onto the photosensitive resin composition with silicone rubber sheet having a thickness of 300 μm being placed between the photomask and the bare silicon wafer as a spacer. The photosensitive resin composition was exposed to UV from up above with 10 mW/cm$^2$ for 3 minutes through the photomask, while sloping a light guide of a UV spot light source 10 degrees from the vertical direction.

Figure 2:
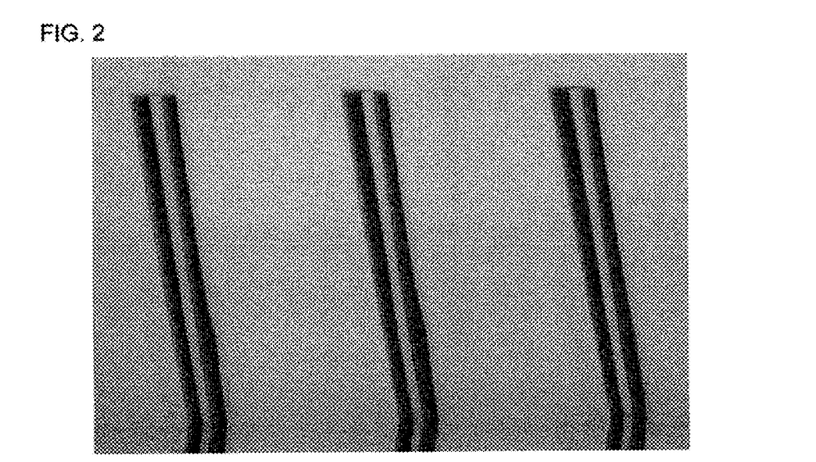
FIG. 2 shows a microscopic observation image of an optical waveguide obtained in Example 2.

An inclined columnar optical waveguide having 50 μm of diameter and 300 μm of height was obtained by washing out the unexposed photosensitive resin composition with a mixed liquid of MIBK/IPA (the mass ratio was 1:1). A microscopic observation image of the obtained optical waveguide is shown in FIG. 2. An inclined angle of the obtained optical waveguide (an angle between the optical waveguide and a surface of the silicon wafer) was 80 degrees.

Comparative Example 1

Figure 3:
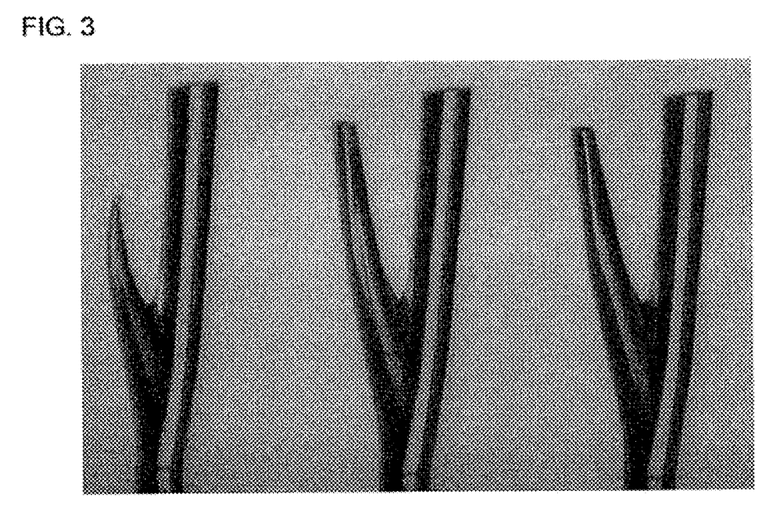
FIG. 3 shows a microscopic observation image of an optical waveguide obtained in Comparative Example 1.

An optical waveguide was obtained in the same manner as in Example 2, except that an anti-reflective coating was not formed on a silicon wafer. A microscopic observation image of the obtained optical waveguide is shown in FIG. 3. As shown in FIG. 3, the waveguide has a V-shape because UV light used for exposure was reflected on the surface of the silicon wafer, and a desirable inclined columnar optical waveguide like the one obtained in Example 2 was not obtained.

[Reference Example 1] Propagation Loss of Optical Waveguide

A silicon wafer having a thermal oxidation film (the film thickness is 2 μm) on the surface thereof was spin-coated (1,500 rpm×60 seconds) with the photosensitive resin composition prepared in Production Example 2. The coating was pattern-exposed with a mask aligner with 17 mW/cm² for 1 minute. A linear-shaped cured product having 40 μm of width, 30 μm of height, and 7 cm of length was obtained by washing out the unexposed photosensitive resin composition with a mixed liquid of MIBK/IPA (the mass ratio was 1:1). The propagation loss of the cured product was measured by the cutback method, in which the core of the optical waveguide was the cured product, a lower clad layer was the silicon thermal oxidation film, and each of an upper and a side clad layers was air. The propagation loss at the desired wavelength was calculated by dispersing output light from the optical waveguide by using an optical spectrum analyzer with white light from a halogen lamp being used as a light source. Two or more of optical waveguides were measured, and an average value thereof was evaluated. The results are shown in Table 1.

TABLE 1

| Measurement Wavelength | 850 nm | 1310 nm | 1550 nm |
|---|---|---|---|
| Propagation Loss [dB/cm] | 0.09 | 0.28 | 0.44 |

As shown in Table 1, it was confirmed that the propagation loss of the optical waveguide obtained from the photosensitive resin composition prepared in Production Example 2 in a wavelength region for optical communications was sufficiently low for actual uses.

[Reference Example 2] Optical Signal Confinement Effect of Optical Waveguide

The photosensitive resin composition prepared in Production Example 2 was added dropwise onto a vertical cavity-surface emitting laser (VCSEL). A photomask having circular openings with diameters of 50 μm was fixed at the position 320 μm up above from the surface of the VCSEL by using a z-axis stage so as to cover the photosensitive resin composition. The photosensitive resin composition was exposed to UV from up above with 10 mW/cm² for 3 minutes through the photomask, by using a UV spot light source. An upright columnar optical waveguide having 46 μm of diameter and 320 μm of height was obtained by washing out the unexposed photosensitive resin composition with a mixed liquid of MIBK/IPA (the mass ratio was 1:1).

Figure 4:
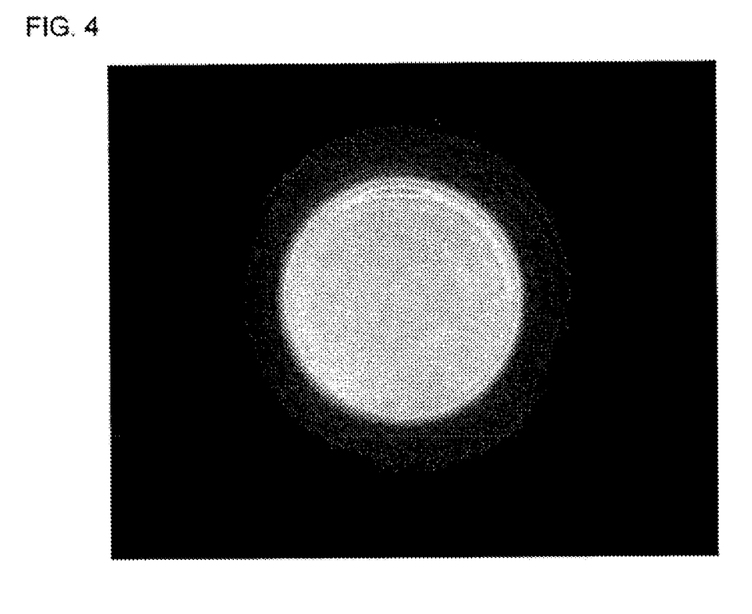
FIG. 4 shows a near field pattern of light that was output from an end surface of an optical waveguide obtained in Reference Example 2.

A CCD camera was placed near the end surface of the optical waveguide formed on the surface-emitting laser, and a near field pattern of light output from the end surface of the optical waveguide was acquired. The result is shown in FIG. 4. It was confirmed that light was output from a region in accordance with the diameter of the optical waveguide, and the confinement effect of the optical signal was high.

[Reference Example 3] Refractive Index of Optical Waveguide 200 mg of the photosensitive resin composition prepared in Production Example 2 was added dropwise onto a glass substrate. The photosensitive resin composition was exposed in a nitrogen atmosphere with 10 mW/cm² for 2 minutes to obtain a cured product.

The refractive index of the obtained cured product at a wavelength of 831.6 nm was 1.592.

INDUSTRIAL APPLICABILITY

As described above, in the present invention, exposure is performed with a light ray entering from an oblique direction to a surface of a support (substrate), and whereby an optical waveguide that inclines to the surface of the support (substrate) in a desired oblique angle can be formed. Moreover, by using the optical waveguide, optical signals having inclined output angles output from a silicon diffraction grating can efficiently be connected.

In this manner, the present invention is extremely useful, because an optical path conversion component for optical-electrical mixed substrates the optical loss of which is significantly low can be produced with a simple method, and thus excellent mass productivity can be achieved.

The invention claimed is:

1. A method for producing an optical waveguide that propagates light from a surface of a support to an oblique direction not vertical to the surface, the method for producing an optical waveguide comprising the steps of:
   (1) providing an anti-reflective coating on the support;
   (2) placing a photosensitive resin composition on the anti-reflective coating, and exposing the photosensitive resin composition to a light ray entering from a direction non-vertical to the surface of the support through a photomask for curing the composition; and
   (3) removing the unexposed photosensitive resin composition by development,
   wherein the anti-reflective coating is a film formed from a polymerizable composition comprising:
   (a) 100 parts by mass of a reactive silicone compound obtained by polycondensing a diaryl silicate compound of Formula [1] and an alkoxy silicon compound of Formula [2] under presence of an acid or a base:

[1]

[2]

(where each of $Ar^1$ and $Ar^2$ is independently a phenyl group optionally substituted with a $C_{1-6}$ alkyl group; $Ar^3$ is a phenyl group having at least one group having a polymerizable double bond or a naphthyl group having at least one group having a polymerizable double bond; $R^1$ is a methyl group or an ethyl group; $R^2$ is a methyl group, an ethyl group, or a vinylphenyl group; and a is 2 or 3), wherein a mixing molar ratio of the diaryl silicate compound of Formula [1] and the alkoxy silicon compound of Formula [2] in the polycondensation reaction is in the range of 1:1 to 1:2; and
   (b) 0.1 to 10 parts by mass of an ultraviolet absorber.

2. The method for producing an optical waveguide according to claim 1, wherein the photosensitive resin composition comprises the reactive silicone compound.

3. An optical waveguide obtained by the method for producing an optical waveguide as claimed in claim 2, wherein the optical waveguide has an aspect ratio of 3 or more.

4. An optical waveguide obtained by the method for producing an optical waveguide as claimed in claim 2, wherein an angle between the optical waveguide and the surface of the support is not less than 60 degrees, but less than 90 degrees.

5. An optical waveguide formed on an anti-reflective coating and obtained by the method for producing an optical waveguide as claimed in claim 1, wherein the optical waveguide has an aspect ratio of 3 or more.

6. An optical waveguide formed on an anti-reflective coating and obtained by the method for producing an optical waveguide as claimed in claim 1, wherein an angle between the optical waveguide and the surface of the support is not less than 60 degrees, but less than 90 degrees.

7. The method for producing an optical waveguide according to claim 1, wherein the polymerizable composition comprises 0.1 to 3 parts by mass of the ultraviolet absorber.

* * * * *